(12) United States Patent
Kuo et al.

(10) Patent No.: US 10,930,603 B2
(45) Date of Patent: Feb. 23, 2021

(54) COAXIAL THROUGH VIA WITH NOVEL HIGH ISOLATION CROSS COUPLING METHOD FOR 3D INTEGRATED CIRCUITS

(71) Applicant: TAIWAN SEMICONDUCTOR MANUFACTURING CO., LTD., Hsin-Chu (TW)

(72) Inventors: Feng Wei Kuo, Zhudong Township (TW); Wen-Shiang Liao, Toufen Township (TW); Chewn-Pu Jou, Hsinchu (TW); Huan-Neng Chen, Taichung (TW); Lan-Chou Cho, Hsinchu (TW); William Wu Shen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/076,976

(22) Filed: Mar. 22, 2016

(65) Prior Publication Data
US 2017/0278806 A1 Sep. 28, 2017

(51) Int. Cl.
*H01L 23/66* (2006.01)
*H01L 23/552* (2006.01)
(Continued)

(52) U.S. Cl.
CPC ........ *H01L 23/66* (2013.01); *H01L 23/49816* (2013.01); *H01L 23/49827* (2013.01);
(Continued)

(58) Field of Classification Search
None
See application file for complete search history.

(56) References Cited

U.S. PATENT DOCUMENTS 5,135,889 A * 8/1992 Allen .................. H01L 23/5225
 438/598
5,874,778 A * 2/1999 Bhattacharyya .... H01L 23/5286
 257/758
(Continued)

FOREIGN PATENT DOCUMENTS

| CN | 101785105 A | | 7/2010 |
|---|---|---|---|
| JP | 2015-060909 A | * | 3/2015 |
| JP | 201560909 A | | 3/2015 |

*Primary Examiner* — Erik Kielin
(74) *Attorney, Agent, or Firm* — Duane Morris LLP

(57) ABSTRACT

A semiconductor package includes a first semiconductor device, a second semiconductor device vertically positioned above the first semiconductor device, and a ground shielded transmission path. The ground shielded transmission path couples the first semiconductor device to the second semiconductor device. The ground shielded transmission path includes a first signal path extending longitudinally between a first end and a second end. The first signal path includes a conductive material. A first insulating layer is disposed over the signal path longitudinally between the first end and the second end. The first insulating layer includes an electrically insulating material. A ground shielding layer is disposed over the insulating material longitudinally between the first end and the second end of the signal path. The ground shielding layer includes a conductive material coupled to ground. The ground shielding layer drives radiation signals received therein to ground to prevent induced noise in the first signal path.

20 Claims, 10 Drawing Sheets

(51) Int. Cl.
  *H01L 23/498* (2006.01)
  *H01L 23/00* (2006.01)
  *H01L 25/18* (2006.01)
  *H01L 23/522* (2006.01)
  *H01L 25/065* (2006.01)

(52) U.S. Cl.
  CPC .. *H01L 23/49833* (2013.01); *H01L 23/49838* (2013.01); *H01L 23/5225* (2013.01); *H01L 23/552* (2013.01); *H01L 24/17* (2013.01); *H01L 25/0657* (2013.01); *H01L 25/18* (2013.01); *H01L 2223/6622* (2013.01); *H01L 2223/6638* (2013.01); *H01L 2224/16225* (2013.01); *H01L 2924/141* (2013.01); *H01L 2924/146* (2013.01); *H01L 2924/1421* (2013.01); *H01L 2924/1432* (2013.01); *H01L 2924/1434* (2013.01); *H01L 2924/1436* (2013.01); *H01L 2924/1443* (2013.01); *H01L 2924/3025* (2013.01)

(56) References Cited

U.S. PATENT DOCUMENTS

| | | | |
|---|---|---|---|
| 6,300,161 B1 * | 10/2001 | Goetz | H01L 23/49827 257/528 |
| 6,462,423 B1 * | 10/2002 | Akram | H01L 23/49822 257/666 |
| 8,279,008 B2 | 10/2012 | Hsieh et al. | |
| 8,338,712 B2 * | 12/2012 | Nguyen | H05K 3/108 174/250 |
| 8,427,240 B2 | 4/2013 | Hsieh et al. | |
| 8,448,100 B1 | 5/2013 | Lin et al. | |
| 8,593,206 B2 | 11/2013 | Chen et al. | |
| 8,610,494 B1 | 12/2013 | Jin et al. | |
| 8,618,631 B2 | 12/2013 | Jin et al. | |
| 8,631,372 B2 | 1/2014 | Yu et al. | |
| 8,669,780 B2 | 3/2014 | Chi | |
| 8,701,073 B1 | 4/2014 | Fu et al. | |
| 8,754,818 B2 | 6/2014 | Yen et al. | |
| 8,896,094 B2 | 11/2014 | Yen et al. | |
| 8,912,581 B2 | 12/2014 | Lin et al. | |
| 8,941,212 B2 | 1/2015 | Yen et al. | |
| 9,016,939 B2 | 4/2015 | Chang et al. | |
| 9,086,452 B2 | 7/2015 | Wang et al. | |
| 9,165,968 B2 | 10/2015 | Chao et al. | |
| 9,171,798 B2 | 10/2015 | Lin et al. | |
| 9,172,242 B2 | 10/2015 | Chang et al. | |
| 9,184,256 B2 | 11/2015 | Huang et al. | |
| 9,209,251 B2 | 12/2015 | Hung et al. | |
| 9,219,038 B2 | 12/2015 | Horng et al. | |
| 10,037,897 B2 * | 7/2018 | Kuo | H01L 21/481 |
| 2009/0057848 A1 * | 3/2009 | Johnson | H01L 23/3114 257/659 |
| 2010/0225425 A1 * | 9/2010 | Cho | H01P 1/2013 333/238 |
| 2013/0134553 A1 * | 5/2013 | Kuo | H01L 24/13 257/532 |
| 2013/0193981 A1 | 8/2013 | Chen et al. | |
| 2013/0246990 A1 | 9/2013 | Yen et al. | |
| 2013/0320553 A1 | 12/2013 | Kuo et al. | |
| 2014/0126274 A1 | 5/2014 | Lee et al. | |
| 2014/0132333 A1 | 5/2014 | Jin et al. | |
| 2014/0167799 A1 | 6/2014 | Wang et al. | |
| 2014/0195728 A1 | 7/2014 | Hsu et al. | |
| 2014/0239427 A1 | 8/2014 | Huang et al. | |
| 2014/0253262 A1 | 9/2014 | Hsieh et al. | |
| 2014/0253391 A1 | 9/2014 | Yen | |
| 2014/0266273 A1 | 9/2014 | Wang et al. | |
| 2015/0145593 A1 | 5/2015 | Johnson | |
| 2015/0364417 A1 | 12/2015 | Lee | |
| 2016/0173803 A1 * | 6/2016 | Fukuoka | H01L 27/14623 348/302 |
| 2016/0315055 A1 * | 10/2016 | Vogt | H01L 24/06 |
| 2017/0093007 A1 * | 3/2017 | Elsherbini | H01P 3/08 |

* cited by examiner

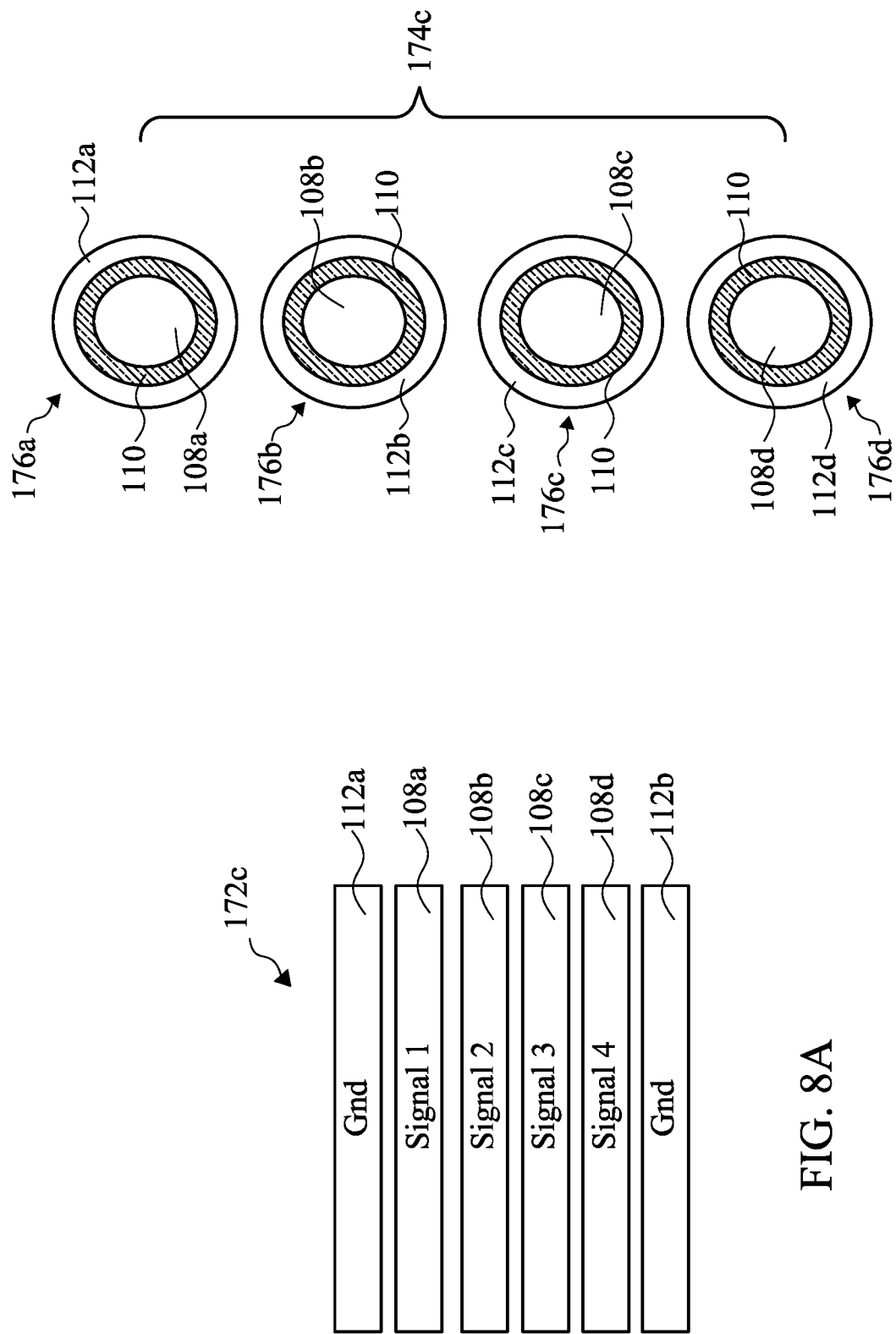

COAXIAL THROUGH VIA WITH NOVEL HIGH ISOLATION CROSS COUPLING METHOD FOR 3D INTEGRATED CIRCUITS

BACKGROUND

Integrated circuits ("ICs") are incorporated into many electronic devices. IC packaging allows for multiple ICs to be vertically stacked in "three-dimensional (3D)" packages in order to save horizontal area on printed circuit boards ("PCBs"). An alternative packaging technique, referred to as 2.5D packaging, may use an interposer, which may be formed from a semiconductor material such as silicon, for coupling one or more semiconductor die to a PCB. A plurality of IC or other semiconductor dies which may be heterogeneous technologies, may be mounted on the interposer.

Many devices on one or more of the semiconductor die may cause electrical noise and/or create electromagnetic ("EM") interference by emitting EM emissions. RF devices and inductors are examples of devices which can create electrical noise and EM interference. A noisy source, such as an RF device, generates electrical noise in signals carried in conductive structures such as metal leads. The electrical noise in the conductive leads can impact various other signals and devices in the package. Noisy electrical signals present serious problems in semiconductor packaging.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

FIG. 8A illustrates a quadrantal ground shielded transmission path, in accordance with some embodiments.

FIG. 8B illustrates a quadrantal ground shielded transmission cable, in accordance with some embodiments.

DETAILED DESCRIPTION OF EXEMPLARY EMBODIMENTS

Figure 1:
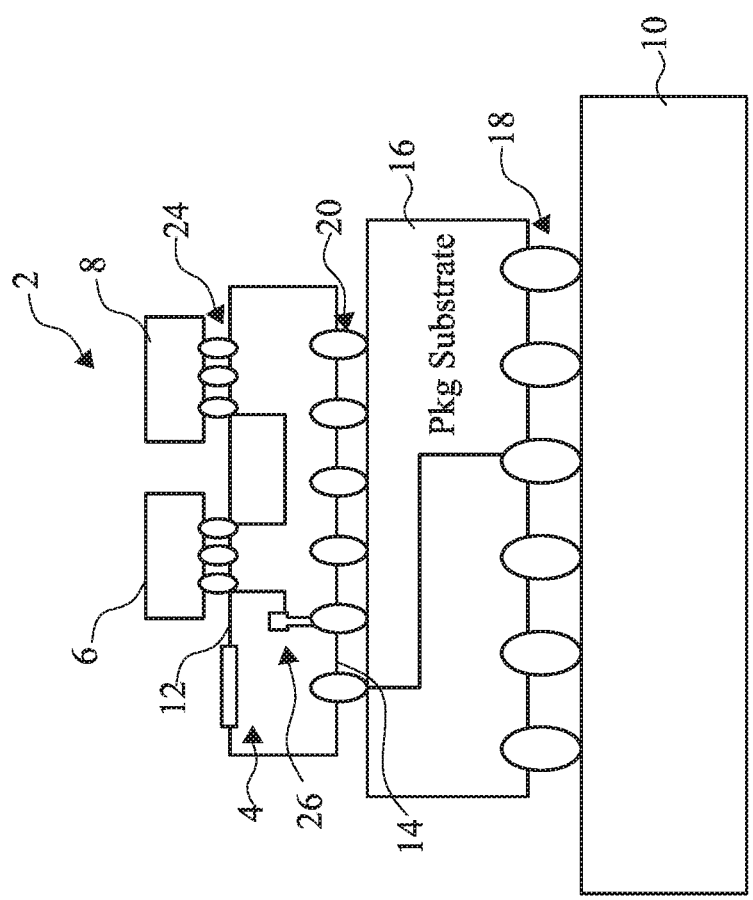
FIG. 1 illustrates a side view of a 2.5D semiconductor package including an interposer, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

In various embodiments, a semiconductor package including a first semiconductor device, a second semiconductor device, and a ground shielded transmission path is disclosed. The ground shielded transmission path couples the first semiconductor device to the second semiconductor device. The ground shielded transmission path includes at least one signal path extending longitudinally between a first end and a second end. The at least one signal path includes an electrically conductive material. In some embodiments, a first insulating layer is disposed over the signal path longitudinally between the first end and the second end. The first insulating layer includes an electrically insulating material. In further embodiments, a ground shielding layer is disposed over the insulating material longitudinally between the first end and the second end of the signal path. The ground shielding layer includes an electrically conductive material coupled to ground.

FIG. 1 illustrates a side view of a semiconductor package 2 having an interposer 4 disposed between a substrate and one or more semiconductor dies (known as a 2.5D semiconductor package), according to some embodiments. In the 2.5D semiconductor package shown in FIG. 1, an interposer 4 is disposed under first and second semiconductor dies 6, 8 and above a package substrate 16. In some embodiments, the interposer 4 comprises base substrate (such as, for example, silicon) having one or more passive devices formed thereon and a plurality of through-silicon vias (TSVs). The interposer 4 couples electrical connections of the semiconductor dies 6, 8 to a package substrate 16 and/or a printed circuit board 10. In some embodiments, the interposer does not contain any active devices. In some embodiments, the differential architecture of the semiconductor package 2 can include fan-out wafer level packaging (InFO-WLP). The semiconductor dies 6, 8 are coupled to the first surface 12 of the interposer 4 and a second surface 14, opposite the first surface 12, of the interposer 4 is directly coupled to a package substrate 16.

In some embodiments, the semiconductor dies 6, 8 comprise one or more active devices. For example, in some embodiments, the semiconductor dies 6, 8 can include a GPS die, a GPS baseband die, a processor (such as an ARM processor) and/or any other suitable active device. The package substrate 16 can comprise any suitable substrate, such as, for example, a ceramic material, and supports one or more electrical connections between the interposer 4 and a PCB 10. The PCB 10 mechanically supports and electrically interconnects two or more IC packages 2 using one or more conductive tracks, pads, and/or other features formed from conductive layers formed on a non-conductive substrate.

The package substrate 16 is joined to PCB 10 by solder balls 18 and to interposer 4 by solder balls 20. Solder balls 24 join the interposer 4 to the first and second semiconductor dies 6, 8. Solder balls are referred to broadly as such, but need not be completely "ball shaped" as in the illustrated embodiment. Solder balls are alternatively referred to as solder bumps and take on various shapes in various embodiments. Solder balls physically join the respective components together and electrically couple electronic features of the respective components together. In some embodiments, one or more of the interposer 4, the semiconductor dies 6, 8, the PCB 10, and/or the package substrate 16 include one or more ground shielded transmission paths 26, discussed in further detail below.

Figure 2:
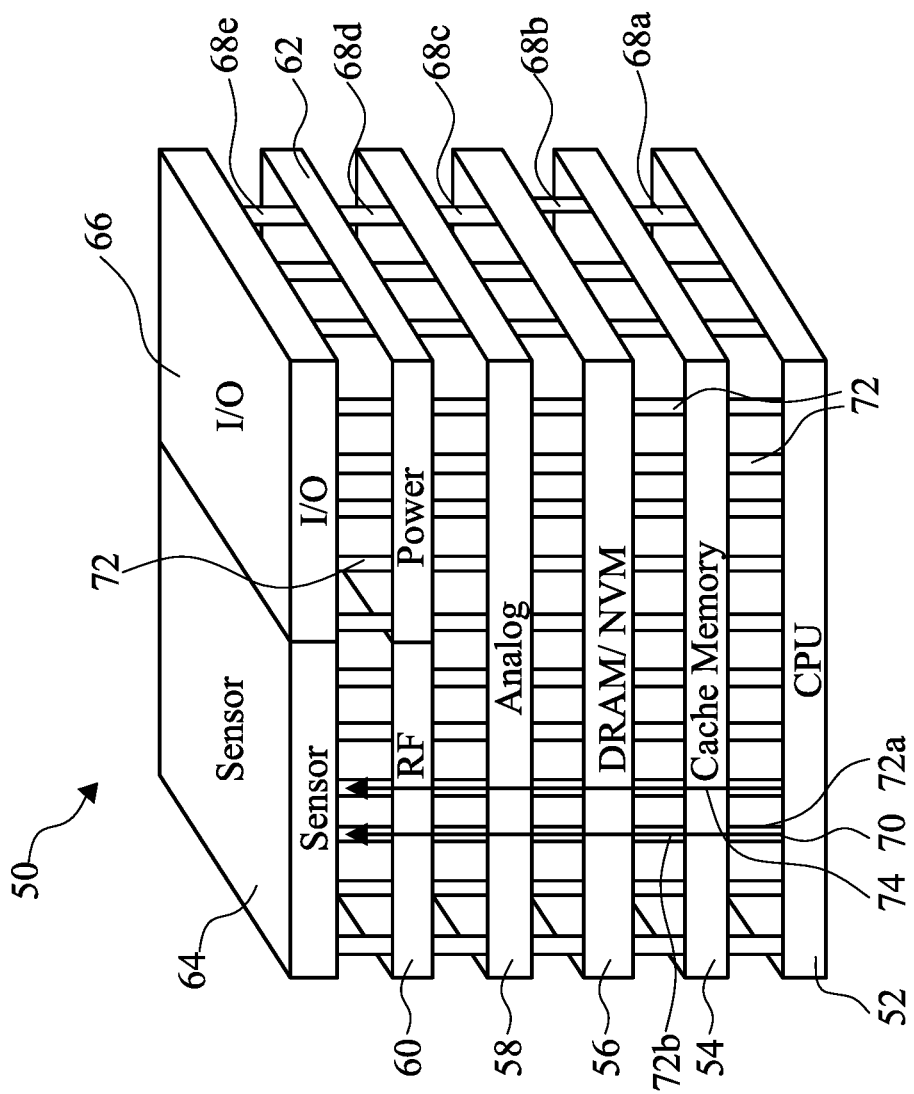
FIG. 2 illustrates a side view of a three-dimensional (3D) semiconductor package, in accordance with some embodiments.

FIG. 2 illustrates a three-dimensional (3D) semiconductor package 50, in accordance with some embodiments. In 3D semiconductor packages as shown in FIG. 2, a plurality of semiconductor dies are stacked on top of each other and include one or more through-silicon vias (TSVs) 70 to allow one or more upper die to communicate with one or more of the lower die. The 3D semiconductor package 50 includes a plurality of semiconductor dies, such as, a CPU 52, a cache memory 54, a Dynamic random-access memory (DRAM)/Non-volatile memory (NVM) 56, an analog device 58, a radiofrequency device 60, a power source 62, one or more sensors 64, and/or one or more input/output (I/O) connections 66. A plurality of through InFO via (TIVs) layers 68a-68e having a plurality of TIVs 72 therein couple the plurality of semiconductor dies. Each of the semiconductor dies may include one or more through-substrate vias (TSVs) 74. In some embodiments, one or more TSVs 74 couple a first TIV 72a formed beneath a semiconductor die 54 to a second TIV 72b formed above the semiconductor die 54. In other embodiments, one or more metal layers and/or vias inside of the semiconductor die can couple a first TIV 72a to a second TIV 72b. Although a specific 3D semiconductor package 50 is discussed herein, it will be appreciated that 3D semiconductor package can include one or more additional dies, one or more fewer dies, one or more alternative dies, and/or one or more 2.5D or 2D semiconductor arrangements therein. In some embodiments, a ground-shielded transmission path includes one or more TIVs and/or one or more TSVs extending through one or more semiconductor dies, as discussed in further detail below with respect to FIGS. 3-5.

Figure 3:
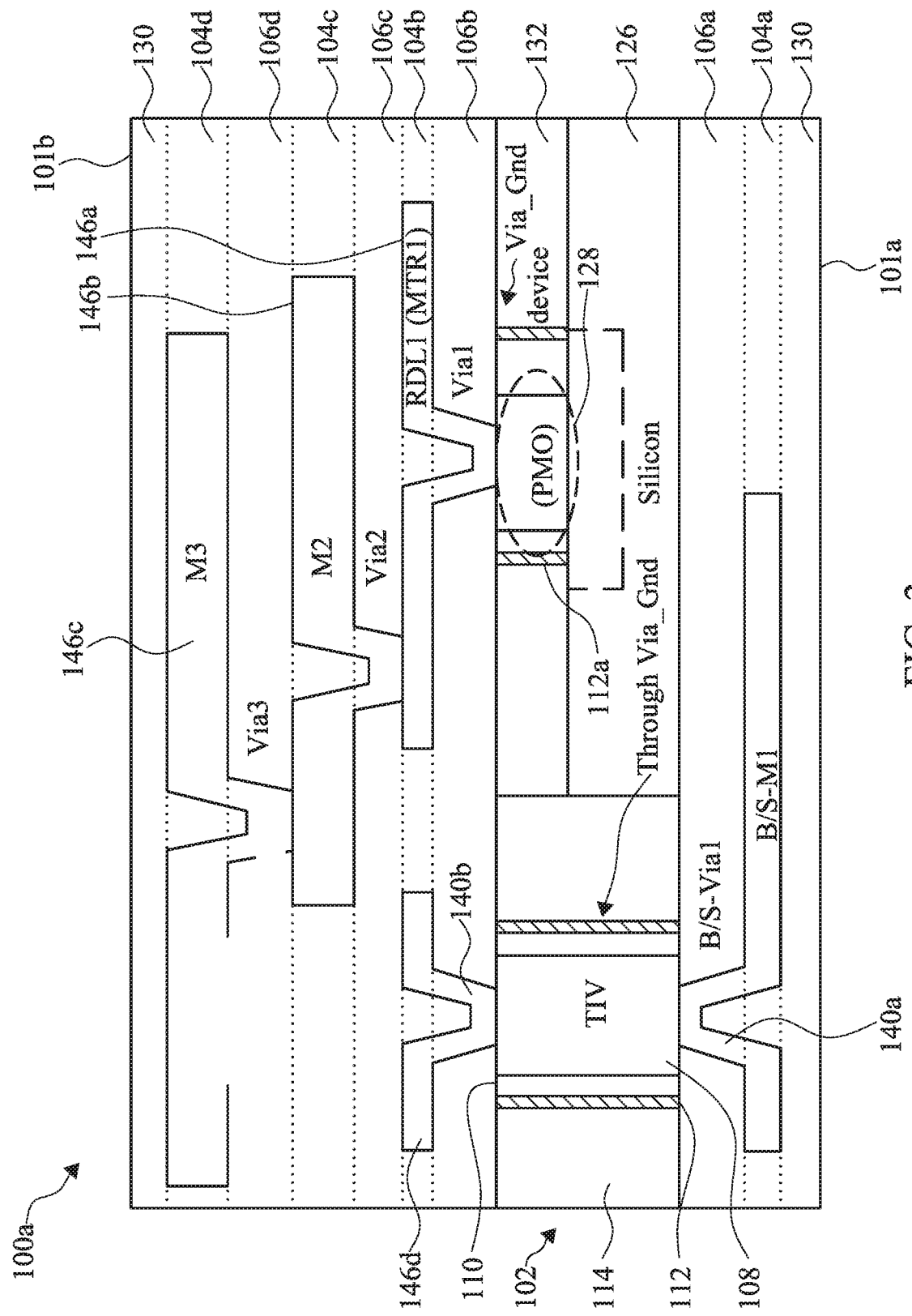
FIG. 3 illustrates a 2.5D semiconductor package including an interposer having ground shielded transmission path, according to some embodiments.

FIG. 3 illustrates a semiconductor package 100a including a ground shielded transmission path 102 coupling a first semiconductor package element 101a and a second semiconductor package element 101b, according to some embodiments. The first semiconductor package element 101a includes at least one metal layer 104a, at least one via layer 106a, and a substrate 130. In some embodiments, the first semiconductor package element 101a can comprise any suitable element, such as, for example, silicon. The second semiconductor package element 101b includes a plurality of metal layers 104b-104d, a plurality of via layers 106b-106d, and a substrate 130. For example, in some embodiments, the second semiconductor package element 101b can include a package substrate, such as the package substrate 16 discussed in conjunction with FIG. 1. In some embodiments, at least one semiconductor die 132 including an active device 128 (PMO) is coupled to the second semiconductor element 101b. An insulating region 126 is disposed between the active device 128 and the first semiconductor package element 101a. In some embodiments, the insulating region 126 includes a silicon material, in accordance with some embodiments. The insulating region 126 can be part of an interposer and/or part of an inter fan-out layer (e.g., a packaging layer) located between the semiconductor die 132 and the first semiconductor package element 101a.

A ground shielded transmission path 102 extends through an inter fan-out (InFO) layer between the first semiconductor package element 101a and the second semiconductor package element 101b. In some embodiments, the ground shielded transmission path 102 extends through an interposer, for example, using a TSV formed in the interposer (not shown). A through-InFO via (TIV) 108 extends through the InFO layer 114 and couples a first via 140a formed in the first via layer 106a of the first semiconductor package element 101a to a second via 140b formed in the first via layer 106b of the second semiconductor package element 101b. The TIV 108 includes a conductive material configured to transmit a signal from the first via 140a to the second via 140b. In some embodiments, the TIV 108 has a cylindrical shape extending along a longitudinal axis.

In some embodiments, the ground shielded transmission path 102 includes an insulation layer 110 formed of a portion of the InFO layer 114 and disposed around an outer surface of the TIV 108 from the first semiconductor package element 101a to the second semiconductor package element 101b. The insulation layer 110 does not extend over a top surface or a bottom surface of the TIV 108. The InFO layer 114 includes an insulating material, such as, for example, a polyimide material. In some embodiments, the insulation layer 110 extends circumferentially about the longitudinal length of the TIV 108.

In some embodiments, the ground shielded transmission path 102 includes a ground shielding layer 112 disposed over and/or around an outer surface of the insulation layer 110 and the TIV 108 from a first semiconductor package element 101a and a second semiconductor package element 101b. The ground shielding layer 112 includes a conductive material coupled to ground. The ground shielding layer 112 is electrically isolated from the TIV 108 by the insulation layer 110. The ground shielding layer 112 isolates the TIV 108 from radiation signals generated by one or more active devices 128 and/or prevent radiation signal transmission to/from the TIV 108. For example, when a radiation signal is generated near the TIV 108, the radiation signal encounters the ground shielding layer 112 before reaching the TIV 108. The ground shielding layer 112 drives the radiation signal to ground, dissipating energy in the radiation signal, and preventing inducement of a signal within the TIV 108 caused by the radiation signal. By preventing transmission of radiation signals into the TIV 108, the ground shielding layer 112 reduces or eliminates radiation induced noise in the TIV 108. Similarly, by preventing transmission of radiation signals from the TIV 108, the ground shielding layer 112 reduces or eliminates radiation induced noise caused by the TIV 108.

In some embodiments, the ground shielding layer 112 fully encircles the sides of the TIV 108. In other embodiments, the ground shielding layer 112 is disposed in layers above and below one or more metal layers 104b-104d to limit radiation transmission between the metal layers 104b-104d, as discussed in more detail with respect to FIG. 4. The ground shielding layer 112 is coupled to a ground, such as, for example, a ground formed in a PCB 10 coupled to the semiconductor package 100. In some embodiments, the InFO layer 114 insulates the ground shielding layer 112 from surrounding package elements and/or additional TIVs formed in the InFO layer 114.

In some embodiments, a ground shielding layer 112a is disposed about an active semiconductor device 128 coupled to the semiconductor package element 101b. The ground shielding layer 112a isolates the semiconductor device 128 from transmitting and/or receiving radiation signals. For example, in some embodiments, the active semiconductor device 128 is an RF emitting device. A ground shielding layer 112a is disposed about the RF emitting device to prevent RF signal transmission from the device interfering with other elements of the semiconductor package 100a, such as, for example, a TIV 108. The ground shielding layer 112a can be coupled to a ground through one or more package elements, such as, for example, a PCB (not shown). The device 128 can include any suitable active semiconductor device that generates and/or is sensitive to receiving radiation transmissions.

Figure 4:
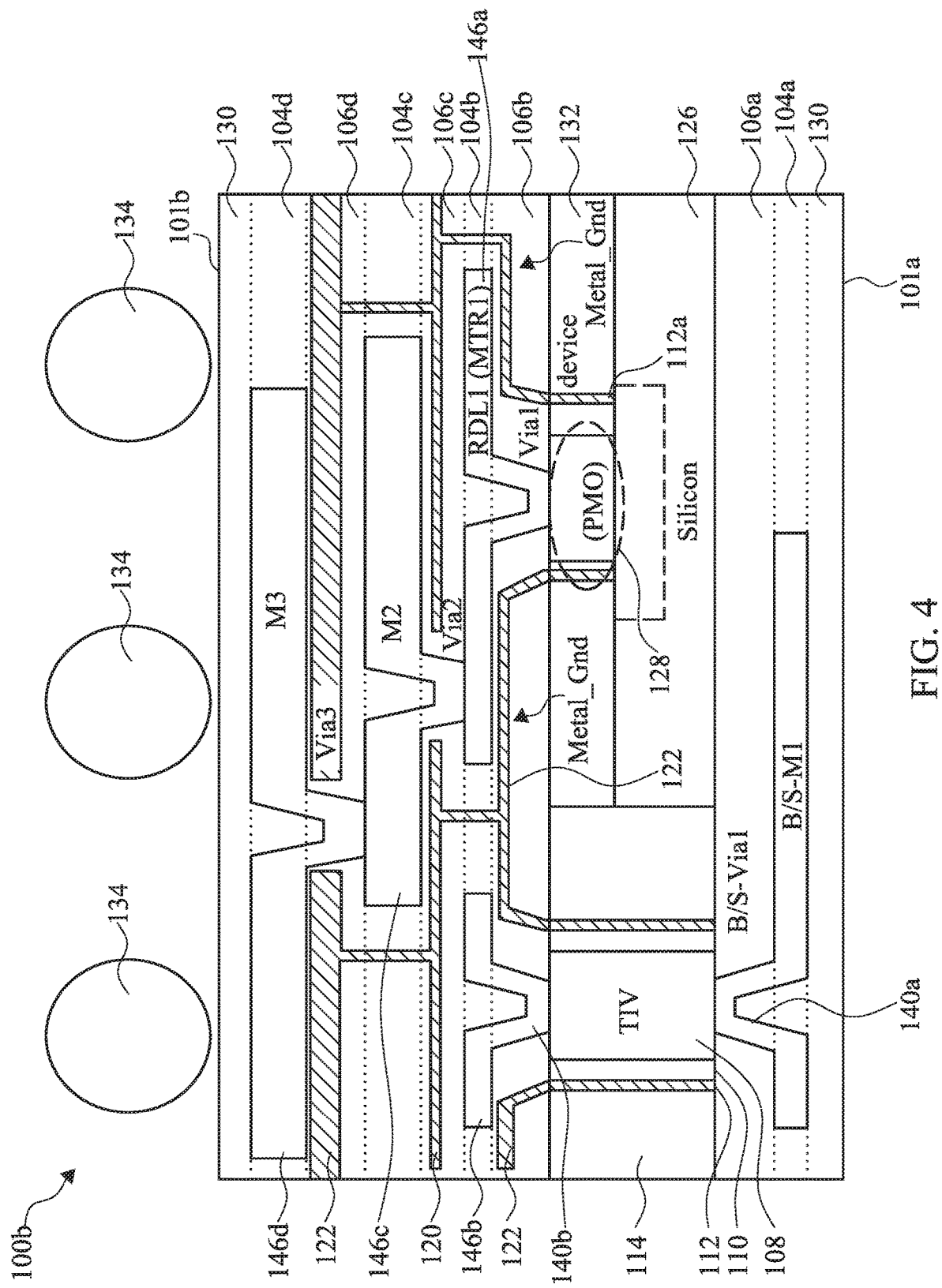
FIG. 4 illustrates a 2.5D semiconductor package including a continuous ground shielding formed in at least one semiconductor device, according to some embodiments.

FIG. 4 illustrates one embodiment of a semiconductor package 100b including a continuous ground shielding layer 120 formed in a second semiconductor package element 101b. The semiconductor package 100b is similar to the semiconductor package 100a discussed with respect to FIG. 2, and similar description is not repeated herein. The continuous ground shielding layer 120 includes a conductive metal material 122 disposed within and between each of the via layers 106b-106d and/or the metal layers 104b-104d of the semiconductor package element 101b. In some embodiments, the conductive metal material 122 extends through the metal layers 104b-104d of the second semiconductor package element 101b in a generally vertical direction and extends through the via layers 106b-106d in a generally horizontal direction, although it will be appreciated that the conductive metal material 122 can extend in any direction within any of the layers of the semiconductor package element 101b. In some embodiments, the continuous ground shielding layer 120 and the conductive metal material 122 isolates each of the metal layers 104b-104d except where vias 140b-140d couple the metal layers 104b-104d. The continuous ground shielding layer 120 is coupled to ground through one or more package elements, such as, for example, a PCB (not shown). The continuous ground shielding layer 120 prevents transmission of radiation signals between metal layers 104b-104d of the second semiconductor package element 101b.

In some embodiments, the continuous ground shielding layer 120 is coupled to the ground shielding layer 112 of the ground shielded transmission path 102 and/or the ground shielding layer 112a. The continuous ground shielding layer 120 and the ground shielding layers 112, 112a are configured to insulate transmission paths, such as the transmission paths 146a-146d formed in the metal layers 104b-104d and the TIV 108, active devices, such as the active semiconductor device 128, and/or other portions of the semiconductor package 100b from one or more radiation signals generated by within the semiconductor package 100, such as, for example, generated by the active semiconductor device 128 and/or transmission of a signal through the signal paths 146a-146d. For example, in some embodiments, a grounded conductive metal material 122 disposed in a first via layer 106b and the second via layer 106c of the second semiconductor package element 101b isolates a first metal layer 104b from radiation signals. Similarly, a grounded conductive metal material 122 disposed in the second via layer 106c and the third via layer 106d isolates a second metal layer 104c from radiation signals.

Although embodiments have been discussed herein with respect to 2.5D packages 100a, 100b, it will be appreciated that a ground shielded transmission path 102 can be disposed in any suitable semiconductor package, such as a 3D semiconductor package. For example, as shown in FIG. 2, a 3D package 50 can include a one or more TIV and/or TSV transmission paths. In some embodiments, the one or more TIV and/or TSV transmission paths include a ground shielded transmission path. The ground shield transmission path 70 in FIG. 2 can extend through one or more InFO layers and/or semiconductor dies of the 3D semiconductor package.

Figure 5:
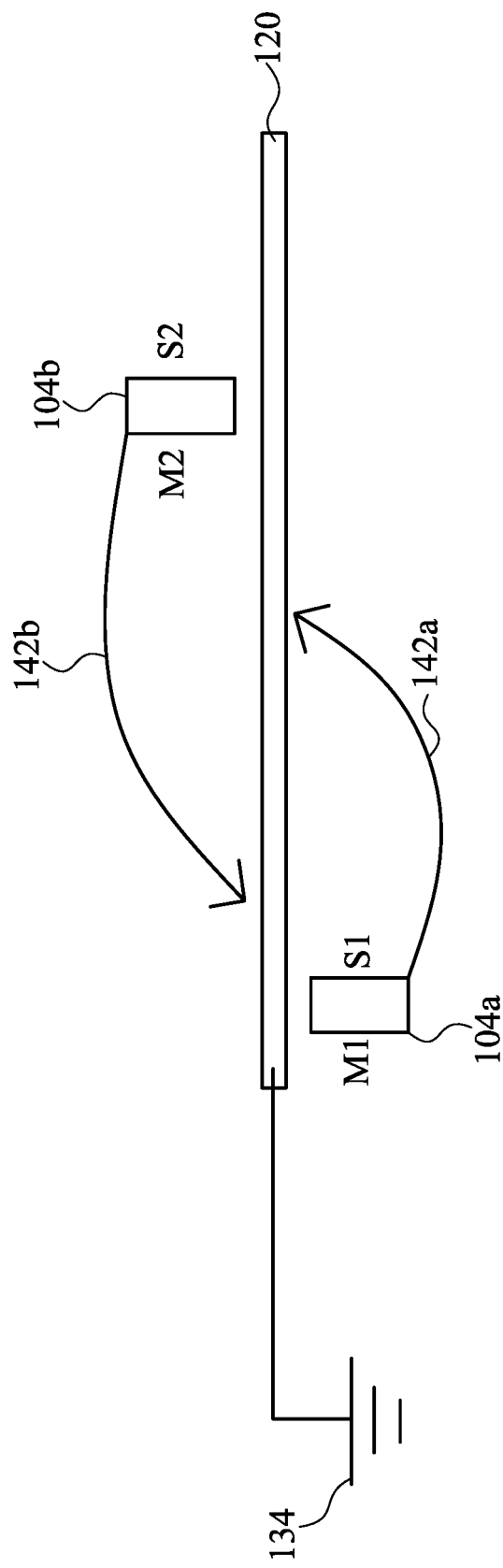
FIG. 5 illustrates operation of a ground shielding between a first metal layer and a second metal layer, in accordance with some embodiments.

FIG. 5 illustrates operation of the continuous ground shielding layer 120 located between a first metal layer 104a and a second metal layer 104b. As shown in FIG. 5, a radiation signal 142a, 142b generated in one of the first metal layer 104a and/or the second metal layer 104b is grounded by continuous ground shielding layer 120 and transmission between the first metal layer 104a and the second metal layer 104b is prevented. For example, in some embodiments, a radiation signal 142a is generated in the first metal layer 104a. The radiation signal 142a is received at the ground shielding layer 120. The ground shielding layer 120 drives the received radiation signal 142a to ground 134, preventing transmission of the radiation signal 104a beyond the ground shielding layer 120. Similarly, in some embodiments, a radiation signal 142b is generated in the second metal layer 104b. The radiation signal 142b is received at the ground shielding layer 120 and driven to ground 134. The ground shielding layer 120 prevents transmission of the radiation signals 142a, 142b, reducing induced noise in each of the metal layers 104a, 104b.

Figure 6A:
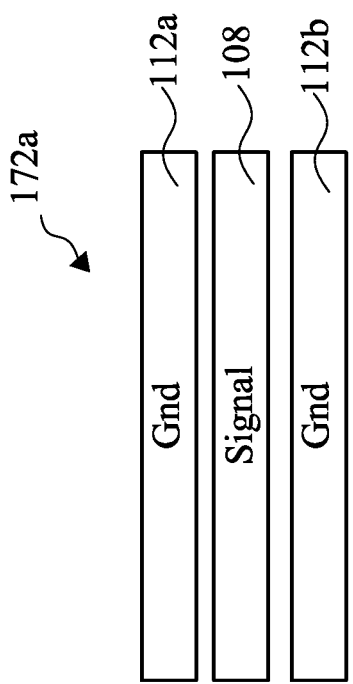
FIG. 6A illustrates a single-path ground shielded transmission path, in accordance with some embodiments.
Figure 6B:
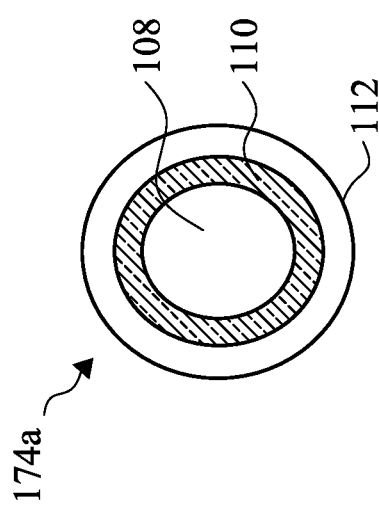
FIG. 6B illustrates a single-path ground shielded transmission cable, in accordance with some embodiments.

FIGS. 6A-8B illustrate various embodiments of ground shielded transmission paths 172a-174c, in accordance with some embodiments. FIGS. 6A and 6B illustrate single-path ground shielded transmission paths 172a, 174a, in accordance with some embodiments. The single path-ground shielded transmission paths 172a, 174a each include a signal path 108 having a ground shielding layer 112 configured to shield the signal path 108. FIG. 6A illustrates a horizontal signal path 108 formed in a first layer and having ground shielding layers 112a, 112b disposed in layers above and below the signal path 108. In some embodiments, the ground shielding layers 112a, 112b include a continuous ground shielding layer 120. FIG. 6B illustrates a vertical signal path 108 having a ground shielding 112 disposed circumferentially about a longitudinal length of the signal path 108. In some embodiments, an insulating layer 110 is disposed between the signal path 108 and the ground shielding layer 112. A portion of the signal path 108, such as an upper surface and a lower surface (not shown) are not covered by the insulating layer 110 or the ground shielding layer 112 to allow for connection of the signal path to one or more via layers and/or semiconductor dies.

Figure 7B:
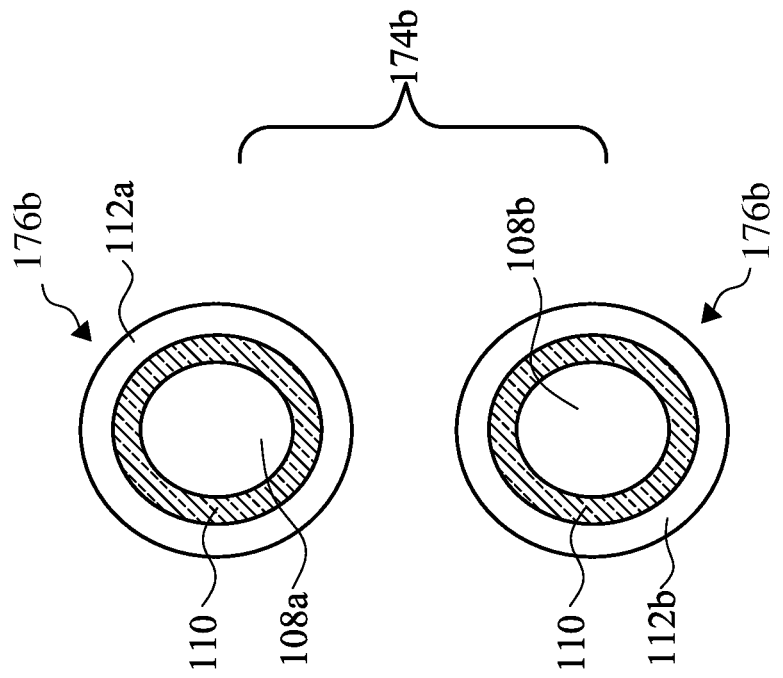
FIG. 7B illustrates a differential ground shielded transmission cable, in accordance with some embodiments.
Figure 7A:
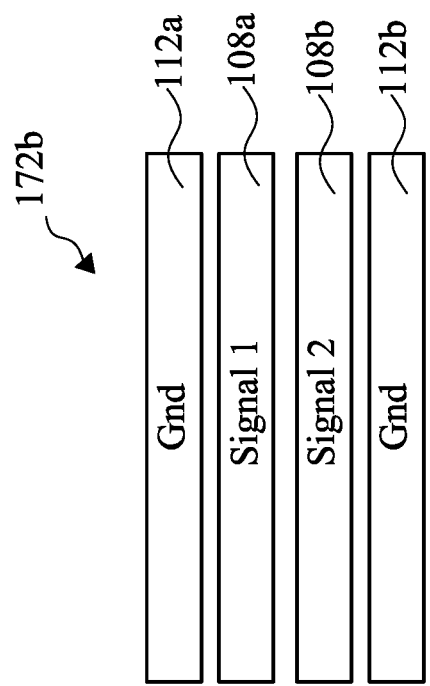
FIG. 7A illustrates a differential ground shielded transmission path, in accordance with some embodiments.

FIGS. 7A and 7B illustrate differential signal paths 172b, 174b including a first signal path 108a and a second signal path 108b, in accordance with some embodiments. Differential signal paths transmit two complementary signals (e.g., differential pair of signals), each in its own conductor. A circuit receiving a differential signal typically responds to the electrical difference between the differential pair. In some embodiments, a ground shielding layer 112 is configured to shield the first and second signal paths 108a, 108b from radiation signal transmission. FIG. 7A illustrates a horizontal differential signal path 172b having the first signal path 108a formed in a first layer of a die and the second signal path 108b formed in a second layer of the die. The ground shielding layer 112 includes an upper ground shielding layer 112a formed in a layer above the first and second signal paths 108a, 108b and a lower ground shielding layer 112b formed in a layer below the first and second signal paths 108a, 108b. FIG. 7B illustrates a vertical differential signal path 174b having individually isolated signal paths 108a, 108b. Each of the signal paths 108a, 108b are fully encircled along a longitudinal length by ground shielding layers 112a, 112b, defining a first signal cable 176a and a second signal cable 176b. An insulating material 110 is located between each of the signal paths 108a, 108b and respective ground shielding layer 112a, 112b. In some embodiments, the first signal cable 176a and the second signal cable 176b can comprise a twisted and/or parallel pair. The twisted and/or parallel pairs can be shielded pairs (e.g., each cable 176a, 176b having a second insulation layer (not shown) disposed over an outer surface of the ground shielding layer 112a, 112b) and/or unshielded pairs (e.g., the ground shield layers 112a, 112b are in direct contact).

FIGS. 8A and 8B illustrate quadrantal signal paths 172c, 174c having a first signal path 104a, a second signal path 104b, a third signal path 104c, and a fourth signal path 104d, in accordance with some embodiments. Quadrantal signal paths transmit two pairs of complementary signals (e.g., two pairs of differential signals), each in its own conductor. A ground shielding layer 112 is configured to shield each of the signal paths 104a-104d from radiation signal transmission. FIG. 8A illustrates a horizontal quadrantal signal path 172c having each of the signal paths 108a-108d formed in adjacent layers of a die. The ground shielding layer 112 includes an upper ground shielding layer 112a formed in a layer above the signal paths 108a-108d and a lower ground shielding layer 112b formed in a layer below the signal paths 108a-108d. FIG. 8B illustrates a vertical differential signal path 174c having individually isolated signal paths 108a-108d. Each of the signal paths 108a-108d are fully encircled along a longitudinal length by ground shielding layers 112a-112d, defining a first signal cable 176a, a second signal cable 176b, a third signal cable 176c, and a fourth signal cable 176d. An insulating material 110 is located between each of the signal paths 108a-108d and respective ground shielding layer 112a-112d. In some embodiments, the first signal cable 176a and the second signal cable 176b can comprise a first twisted and/or parallel pair and the third signal cable 176c and the fourth signal cable 176d can comprise a second twisted and/or parallel pair. The twisted and/or parallel pairs can be shielded pairs (e.g., each cable 176a-176d having a second insulation layer (not shown) disposed over an outer surface of the ground shielding layer 112a-112d) and/or unshielded pairs (e.g., the ground shield layers 112a-112d of each of the twisted pairs are in direct contact).

Figure 9:
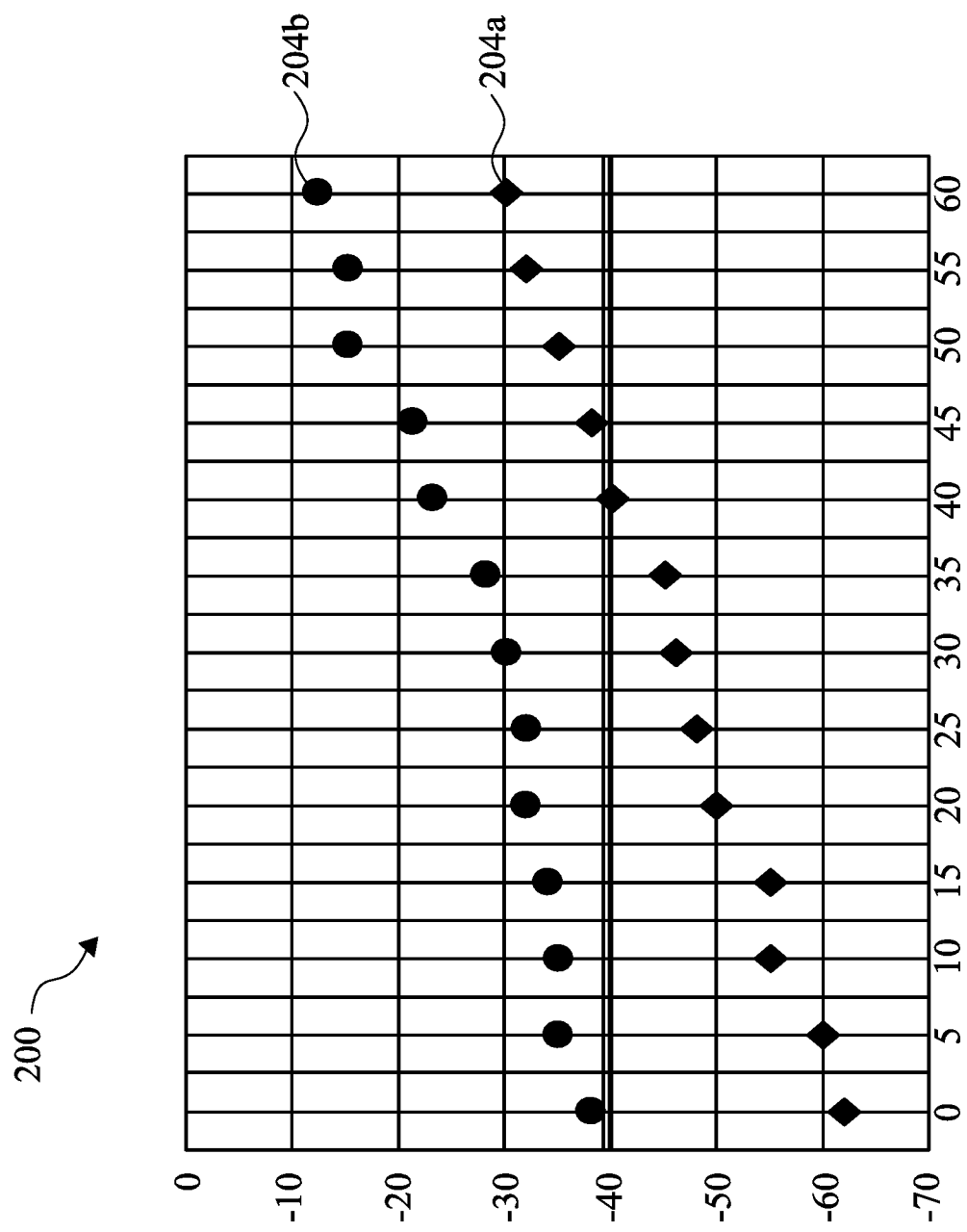
FIG. 9 is a chart illustrating transmission noise between a ground shielded transmission path and an unshielded transmission path, in accordance with some embodiments.

FIG. 9 is a chart 200 illustrating induced transmission noise in a ground shielded transmission path 204a and an unshielded transmission path 204b. The shielded transmission path 204a and the unshielded transmission path 204b are shown in with the frequency of the signal in GHz (gigahertz) on the x-axis and the isolation of the signal in dB (decibels) on the y-axis. As shown in FIG. 9, the unshielded transmission path 204b has an induced signal level of between about −40 and −10 dB. In contrast, the shielded transmission path 204a has an induced signal level of between about −60 and −30 dB. The induced signals in the shielded transmission path 204a has a substantially lower induced signal strength, such as, an induced signal of about 20 dB less, as compared to the unshielded transmission path 204b. In some embodiments, a minimum isolation is required. For example, FIG. 9 includes a limit line 206 indicating a minimum isolation of −40 dB in one embodiment.

Figure 10B:
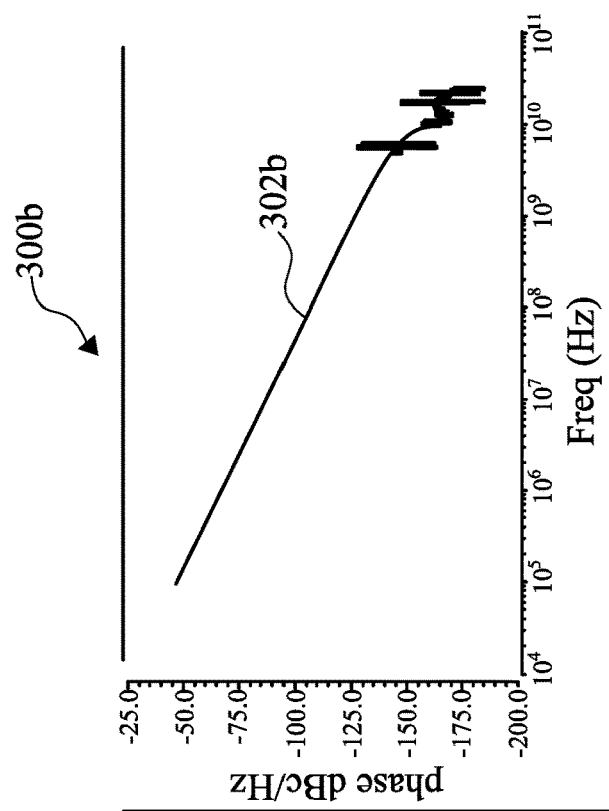
FIG. 10B is a chart illustrating induced noise in a ground shielded transmission path, in accordance with some embodiments.
Figure 10A:
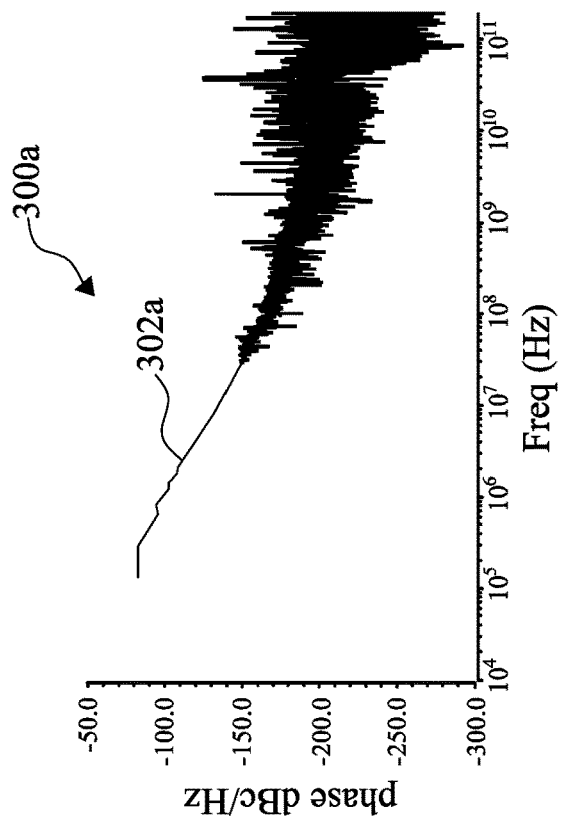
FIG. 10A is a chart illustrating induced noise in an unshielded transmission path.

FIG. 10A is a chart 300a illustrating induced noise 302a in an unshielded transmission path. FIG. 10B is a chart 300b illustrating induced noise 302b in a shielded transmission path. As shown in FIGS. 10A and 10B, the induced noise 302b in the shielded transmission path is significantly less than the induced noise 302a in the unshielded transmission path. The induced noise 302a, 302b is shown with frequency of a transmitted signal in GHz on the x-axis and phase noise in dBc/Hz on the y-axis. In some embodiments, a maximum phase noise is required. For example, in some embodiments, ground shielding is selected such that the phase noise is less than −100 dBc/Hz. The reduced induced noise 302b of the shielded transmission path allows for lower signal power to be transmitted over the shielded transmission path.

In various embodiments, a semiconductor package is disclosed. The semiconductor package includes a first semiconductor device, a second semiconductor device vertically positioned above the first semiconductor device, and a ground shielded transmission path. The ground shielded transmission path couples the first semiconductor device to the second semiconductor device. The ground shielded transmission path includes at least one signal path extending longitudinally between a first end and a second end. The at least one signal path includes an electrically conductive material. The first end is electrically coupled to the first semiconductor device and the second end is electrically coupled to the second semiconductor device. A first insulating layer is disposed over the signal path longitudinally between the first end and the second end. The first insulating layer includes an electrically insulating material. A ground shielding layer is disposed over the insulating material longitudinally between the first end and the second end of the signal path. The ground shielding layer includes an electrically conductive material coupled to ground. The ground shielding layer drives radiation signals received therein to ground to prevent induced noise in the at least one signal path.

In various embodiments, a semiconductor device is disclosed. The semiconductor device includes a first signal path extending horizontally through a first conductive layer and a continuous ground shielding. The continuous ground shielding includes a first conductive material extending horizontally through a first via layer above the first conductive layer and a second conductive material extending horizontally through a second via layer below the first conductive material. The first and second conductive materials are coupled to ground. The continuous ground shielding drives radiation signals received therein to ground to prevent induced noise in the first signal path.

In various embodiments, a semiconductor package is disclosed. The semiconductor package includes a first semiconductor device and a second semiconductor device. The second semiconductor device includes a continuous ground shielding. The continuous ground shielding includes a horizontal conductive material disposed in each via layer of the second semiconductor device and a vertical conductive material disposed in each metal layer of the second semiconductor device. A ground shielded transmission path couples the first semiconductor device to the second semiconductor device. The ground shielded transmission path includes at least one signal path extending longitudinally between a first end and a second end. The at least one signal path includes an electrically conductive material. A first insulating layer is disposed over the signal path longitudinally between the first end and the second end. The first insulating layer includes an electrically insulating material. A ground shielding layer is disposed over the insulating material longitudinally between the first end and the second end of the signal path. The ground shielding layer includes an electrically conductive material. Each of the continuous ground shielding and the ground shielding layer are coupled to ground.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor package, comprising:
a first semiconductor device comprising a first via layer, a first metal layer formed over
the first via layer, a second via layer formed over the first metal layer, and a second metal layer formed over the second via layer;
a second semiconductor device positioned below the first semiconductor device;
an inter fan-out layer disposed between the first semiconductor device and the second semiconductor device and below the first via layer, wherein the inter fan-out layer comprises a semiconductor die containing an active device therein, a first insulation layer disposed under the semiconductor die, and a first ground shielding structure within the semiconductor die and disposed about the active device so as to isolate the active device from radiation signals, wherein the first ground shielding structure extends from a top surface of the semiconductor die to a bottom surface of the semiconductor die to contact a top surface of the first insulation layer; and a ground shielded transmission path coupling the first semiconductor device to the second semiconductor device, wherein the ground shielded transmission path extends through the inter fan-out layer, the ground shielded transmission path comprising:
a conductive via structure located adjacent the active device and extending from a bottom surface of the inter fan-out layer to a top surface of the inter fan-out layer;
a second insulation layer disposed to laterally surround the conductive via structure from the bottom surface to the top surface of the inter fan-out layer; and
a second ground shielding structure disposed to laterally surround the second insulation layer and the conductive via structure from the bottom surface to the top surface of the inter fan-out layer, wherein the second ground shielding structure is conductively coupled to the first ground shielding structure and a ground of the semiconductor package; and
a continuous ground shielding layer extending laterally through the second via layer over the active device and the conductive via structure so as to isolate the first and second metal layers from each other except where one or more vias couple the first and second metal layers, wherein the continuous ground shielding layer is conductively coupled to the first and second ground shielding structures.

2. The semiconductor package of claim 1, wherein the inter fan-out layer insulates the first and second ground shielding structures.

3. The semiconductor package of claim 1, wherein the second ground shielding structure comprises a cylindrical shape and is disposed circumferentially about the second insulation layer and the conductive via structure.

4. The semiconductor package of claim 1, further comprising a third ground shielding structure disposed within the second semiconductor device.

5. The semiconductor package of claim 4, wherein the third ground shielding structure is disposed between each conductive layer of the second semiconductor device.

6. The semiconductor package of claim 5, wherein the third ground shielding structure is disposed in a plurality of via layers between conductive layers of the second semiconductor device.

7. A semiconductor package, comprising:
a first semiconductor device comprising a first via layer, a first metal layer formed over the first via layer, a second via layer formed over the first metal layer, and a second metal layer formed over the second via layer;
a second semiconductor device positioned below the first semiconductor device;
an inter fan-out layer disposed between the first semiconductor device and the second semiconductor device and below the first via layer, wherein the inter fan-out layer comprises a semiconductor die containing an active device therein, a first insulation layer disposed under the semiconductor die, and a first ground shielding structure within the semiconductor die and disposed about the active device so as to isolate the active device from radiation signals, wherein the first ground shielding structure extends from a top surface of the semiconductor die to a bottom surface of the semiconductor die to contact a top surface of the first insulation layer;
a ground shielded transmission path coupling the first semiconductor device to the second semiconductor device, wherein the ground shielded transmission path extends through the inter fan-out layer, the ground shielded transmission path comprising:
- a first conductive via structure located adjacent the active device and extending from a bottom surface of the inter fan-out layer to a top surface of the inter fan-out layer;
- a second insulation layer disposed to laterally surround the first conductive via structure from the bottom surface to the top surface of the inter fan-out layer; and
- a second ground shielding structure disposed to laterally surround the second insulation layer and the first conductive via structure from the bottom surface to the top surface of the inter fan-out layer, wherein the second ground shielding structure is conductively coupled to the first ground shielding structure and a ground of the semiconductor package; and
- a first continuous ground shielding layer formed in the second via layer extending laterally over the first conductive via structure and the active device so as to isolate the first and second metal layers from each other except where one or more second conductive via structures couple the first and second metal layers, wherein the first continuous ground shielding layer is conductively coupled to the first and second ground shielding structures.

8. The semiconductor package of claim 7, further comprising a third conductive via structure extending from a top surface of the first metal layer to a top surface of the inter fan-out layer, wherein the third conductive via structure is insulated from the ground shielded transmission path and is conductively coupled to the active device.

9. The semiconductor package of claim 8, further comprising:
- a third via layer formed over the second metal layer; and
- a second continuous ground shielding layer formed in the third via layer and extending laterally over the third conductive via structure and the active device.

10. The semiconductor package of claim 9, wherein the second continuous ground shielding layer is conductively coupled to the first continuous grounding shielding layer and the first and second ground shielding structures.

11. The semiconductor package of claim 9, further comprising:
- a third metal layer formed over the third via layer; and
- a fourth conductive via structure extending from the third metal layer to the second metal layer, wherein the fourth conductive via structure is insulated from the second continuous ground shielding layer and conductively coupled to the third conductive via structure.

12. The semiconductor package of claim 7, wherein the second ground shielding structure comprises a cylindrical shape and is disposed circumferentially about the second insulation layer and the first conductive via structure.

13. The semiconductor package of claim 7, wherein the active device comprises a radio frequency emitting device.

14. A semiconductor package, comprising:
- a first semiconductor device comprising a first via layer, a first metal layer formed over the first via layer, a second via layer formed over the first metal layer, and a second metal layer formed over the second via layer;
- a second semiconductor device positioned below the first semiconductor device;
- an inter fan-out layer disposed between the first semiconductor device and the second semiconductor device and below the first via layer, wherein the inter fan-out layer comprises a semiconductor die containing an active device therein, a first insulation layer disposed under the semiconductor die, and a first ground shielding structure within the semiconductor die and disposed about the active device so as to isolate the active device from radiation signals, wherein the first ground shielding structure extends from a top surface of the semiconductor die to a bottom surface of the semiconductor die to contact a top surface of the first insulation layer;
- a ground shielded transmission path coupling the first semiconductor device to the second semiconductor device, wherein the ground shielded transmission path extends through the inter fan-out layer; and
- a first continuous ground shielding layer extending laterally through the second via layer over the active device so as to isolate the first and second metal layers from each other except where one or more first conductive via structures couple the first and second metal layers, wherein the continuous ground shielding layer is conductively coupled to the first ground shielding structure and ground.

15. The semiconductor package of claim 14, wherein the ground shielded transmission path comprises:
- a second conductive via structure located adjacent the active device and extending from a bottom surface of the inter fan-out layer to a top surface of the inter fan-out layer;
- a second insulation layer disposed to laterally surround the second conductive via structure from the bottom surface to the top surface of the inter fan-out layer; and
- a second ground shielding structure disposed to laterally surround the second insulation layer and the second conductive via structure from the bottom surface to the top surface of the inter fan-out layer, wherein the second ground shielding structure is conductively coupled to the first ground shielding structure and a ground of the semiconductor package.

16. The semiconductor package of claim 15, wherein the second ground shielding structure comprises a cylindrical shape and is disposed circumferentially about the second insulation layer and the second conductive via structure.

17. The semiconductor package of claim 15, further comprising a third ground shielding structure disposed within the second semiconductor device.

18. The semiconductor package of claim 17, wherein the third ground shielding structure is disposed between each conductive layer of the second semiconductor device.

19. The semiconductor package of claim 18, wherein the third ground shielding structure is disposed in a plurality of via layers between conductive layers of the second semiconductor device.

20. The semiconductor package of claim 15, further comprising:
- a third via layer formed over the second metal layer; and
- a second continuous ground shielding layer formed in the third via layer and extending laterally over the second conductive via structure and the active device, wherein the second continuous ground shielding layer is conductively coupled to the first continuous grounding shielding layer and the first and second ground shielding structures;
- a third metal layer formed over the third via layer; and
- a third conductive via structure extending from the third metal layer to the second metal layer, wherein the third conductive via structure is insulated from the second continuous ground shielding layer and conductively coupled to the second conductive via structure, wherein the second continuous ground shielding layer extends laterally through the second via layer over the active device so as to isolate the second and third metal layers from each other except where the third conductive via structure couples the second and third metal layers.

* * * * *